(12) United States Patent
Brazis et al.

(10) Patent No.: US 7,030,666 B2
(45) Date of Patent: Apr. 18, 2006

(54) ORGANIC SEMICONDUCTOR INVERTING CIRCUIT

(75) Inventors: Paul W. Brazis, South Elgin, IL (US); Hakeem B. Adewole, Chicago, IL (US); Daniel R. Gamota, Palatine, IL (US); Jie Zhang, Buffalo Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 25 days.

(21) Appl. No.: 10/788,627

(22) Filed: Feb. 27, 2004

(65) Prior Publication Data

US 2005/0189968 A1 Sep. 1, 2005

(51) Int. Cl.
*H03B 1/00* (2006.01)
*H03K 3/00* (2006.01)

(52) U.S. Cl. .................. 327/112; 327/427; 326/119
(58) Field of Classification Search ........... 327/112, 327/333; 326/112, 119, 81, 83
See application file for complete search history.

(56) References Cited

U.S. PATENT DOCUMENTS

| | | | | |
|---|---|---|---|---|
| 3,988,616 A * | 10/1976 | Shimada | ................ | 345/52 |
| 4,547,681 A * | 10/1985 | Egawa | ................ | 327/74 |
| 5,854,139 A | 12/1998 | Aratani et al. | ................ | 438/780 |
| 2002/0039042 A1 * | 4/2002 | Jinzai | ................ | 327/333 |
| 2003/0085397 A1 * | 5/2003 | Geens et al. | ................ | 257/40 |
| 2005/0003574 A1 * | 1/2005 | Yang et al. | ................ | 438/99 |

OTHER PUBLICATIONS

Knobloch, A.; Bernds, A.; Clemens, W. "Printed Polymer Transisters" Siemens Corporate Technology, IEEE 2001 Section 4: Polymer Electronic Devices II.
Klauk, H.; Gundlach, D.; Jackson, T. "Fast Organic Thin Film Transistor Circuits" IEEE Electron Device Letters, vol. 20, No. 6, pp. 289-291, Jun. 1999.
Ullmann, A.; Flicker, J.; Fix, W.; Rost, H.; Clemens, W.; "High Performance Organic Filed-Effect Transistors and Integrated Inverters" Mat. Rec. Soc. Symp. Proc. vol. 665, 2001 Material Research Society.

* cited by examiner

*Primary Examiner*—Quan Tra

(57) ABSTRACT

An organic semiconductor inverting circuit includes at least three organic transistors, an output terminal (110, 210, 310, 410), a reference supply voltage input (115, 215, 315, 415), a first positive supply voltage input (120, 220, 320, 420), and a negative supply voltage input (125, 225, 325, 425). One of the three organic transistors is an input transistor having a gate to which is coupled an input terminal (105, 205, 305, 405). The output terminal (110, 210, 310, 410) is coupled to a first electrode of at least one of the at least three organic transistors.

14 Claims, 2 Drawing Sheets

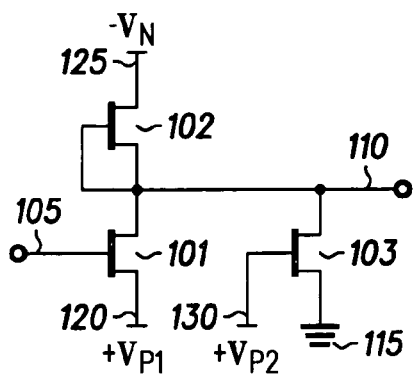
100  *FIG. 1*
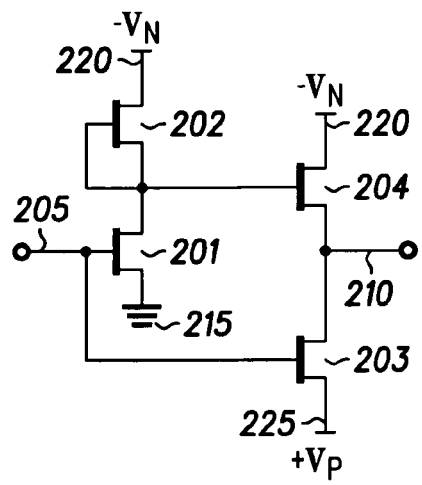
200  *FIG. 2*
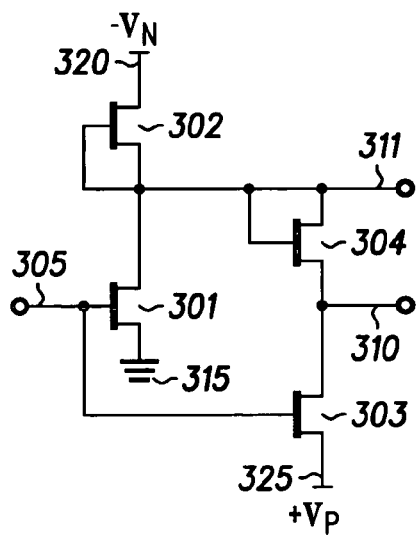
300, 350  *FIG. 3*
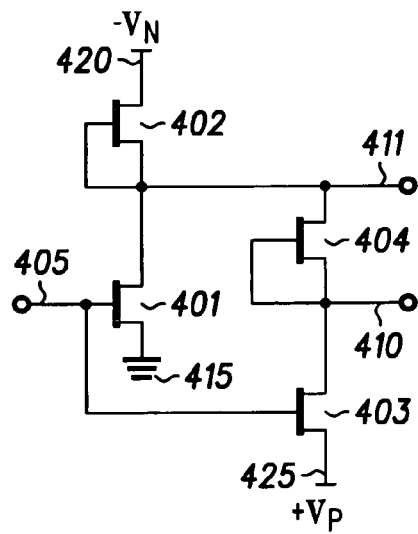
400, 450  *FIG. 4*
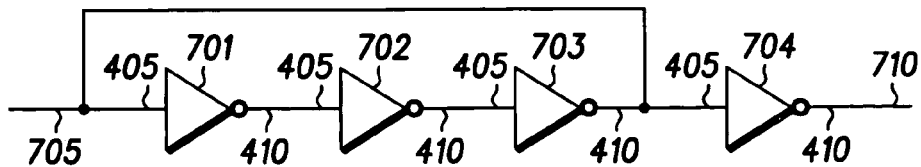
700  *FIG. 7* ved the benefit of the description herein.

ORGANIC SEMICONDUCTOR INVERTING CIRCUIT

BACKGROUND

Organic circuits are being investigated because of their promise of providing very low cost circuits for such uses as identification tags, electronic bar codes, and indicators. The low cost arises from their operational characteristics as semiconductors when formed in an amorphous material state, which can be achieved by printing techniques similar to those in wide use today for passive graphic arts and membrane printing (e.g. gravure, flexography, intaglio, screen printing, micro dispensing, micro contact printing, and lithographic printing). However, the present state of printed circuit electronics introduces limitations for circuitry design. The most severe limitations of printed organic electronics are: low on/off ratio (100 to 10,000), significantly large positive threshold voltage (that cannot be controlled by doping, as it typically is in inorganic circuits), and p-channel FETs only (n-channel FETs are not presently compatible with printing technologies). Such limitations are not usually addressed in the art of crystalline and semi-crystalline semiconductors, because such issues are virtually unknown in conventional semiconductor technologies. Due to the present limitations of organic semiconductor devices, conventional circuit design rules (e.g., CMOS logic) cannot be directly applied. For example, two-transistor p-channel inverter designs are not known that result in useful logic circuitry because voltage inputs and outputs are not compatible with one another.

BRIEF DESCRIPTION OF THE DRAWINGS

The present invention is illustrated by way of example and not limitation in the accompanying figures, in which like references indicate similar elements, and in which:

FIGS. 1–4 are electrical schematic diagrams that show organic semiconductor inverting circuits (OSICs), in accordance with embodiments of the present invention;

FIG. 7 is an electrical schematic that shows a ring oscillator, in accordance with an embodiment of the present invention.

Figure 5:
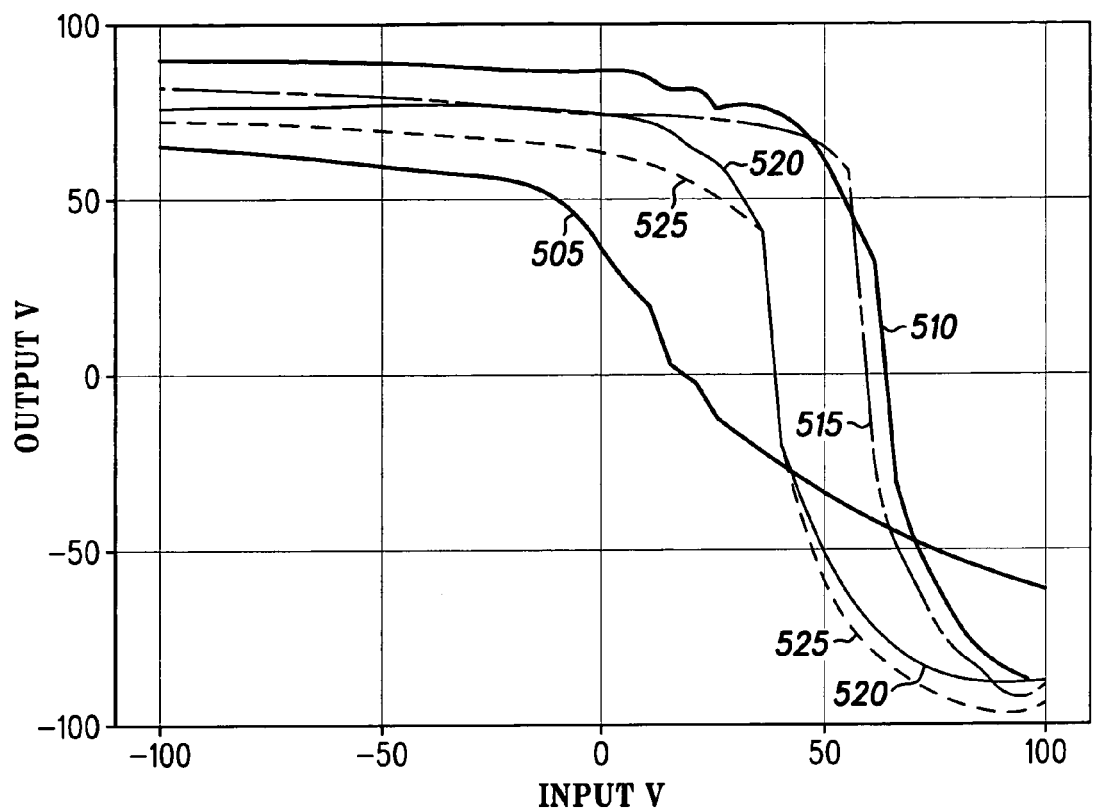
FIG. 5 is a graph that shows plots of exemplary curves obtained by testing samples of OSICs, in accordance with embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Before describing in detail the particular organic semiconductor inverting circuit in accordance with the present invention, it should be observed that the present invention resides primarily in combinations of apparatus components related to organic semiconductor inverting circuitry. Accordingly, the apparatus components have been represented where appropriate by conventional symbols in the drawings, showing only those specific details that are pertinent to understanding the present invention so as not to obscure the disclosure with details that will be readily apparent to those of ordinary skill in the art having the benefit of the description herein.

Referring to FIG. 1, an electrical schematic diagram shows an organic semiconductor inverting circuit (OSIC) 100, in accordance with a first embodiment of the present invention. The OSIC 100 comprises three organic transistors (OTs) 101, 102, 103, an input terminal 105, and an output terminal 110. OT 101 is an input transistor that has a gate coupled to the input terminal 105; a first electrode coupled to a gate and a second electrode of OT 102, to a first electrode of OT 103, and to the output terminal 110; and a second electrode coupled to a first positive supply voltage input 120 to which may be applied a voltage of value $+V_{P1}$. The OT 102 has a first electrode coupled to a negative supply voltage input 125 to which may be applied a voltage of value $-V_N$. The OT 103 has a gate coupled to a second positive supply voltage input 130 to which may be applied a voltage of value $+V_{P2}$ and a second electrode coupled to a reference supply voltage input 115 (to which is applied a voltage which is the reference for the other supply voltages, and which is also referred to as a ground of the OSIC 100). The absolute values of the voltages applied to the first and second positive supply voltage inputs 120, 130 and negative supply voltage input 125 may be equivalent, but they are not necessarily equivalent. In a first variation of the first embodiment, the first positive supply voltage and the negative supply voltage have the same absolute value ($|-V_N|=|+V_{P1}|$). In a second variation of the first embodiment the second positive supply voltage input 130 is the same as the reference supply voltage input 115. In a third variation of the first embodiment, there is no second positive supply voltage 130 input and the gate of OT 103 is coupled to the first positive supply voltage input 120.

Referring to FIG. 2, an electrical schematic diagram shows an organic semiconductor inverting circuit (OSIC) 200, in accordance with a second embodiment of the present invention. The OSIC 200 comprises four organic transistors (OTs) 201, 202, 203, 204, an input terminal 205, and an output terminal 210. OT 201 is an input transistor that has a gate coupled to the input terminal 205 and to a gate of OT 203; a first electrode coupled to a gate and a second electrode of OT 202 and to a gate of OT 204; and a second electrode coupled to a reference supply voltage input 215 (that is also referred to as a ground of the OSIC 200). The OT 202 and the OT 204 have first electrodes coupled to a negative supply voltage input 220 to which may be applied a voltage of value $-V_N$. The OT 203 has a second electrode coupled to a positive supply voltage input 225 to which may be applied a voltage of value $+V_P$. The absolute values of the positive and negative supply voltages, $+V_P$ and $-V_N$, may be equivalent, but are not necessarily equivalent.

Referring to FIG. 3, an electrical schematic diagram shows an organic semiconductor inverting circuit (OSIC) 300, 350 in accordance with third and fourth embodiments of the present invention. The OSIC 300 comprises four organic transistors (OTs) 301, 302, 303, 304, an input terminal 305, and an output terminal 310. OT 301 is an input transistor that has a gate coupled to the input terminal 305 and to a gate of OT 303; a first electrode coupled to a gate and a second electrode of OT 302, to a gate and first electrode of OT 304; and a second electrode coupled to a reference supply voltage input 315 (also referred to as a ground of the OSIC 300). The OT 302 has a first electrode coupled to a negative supply voltage input 320 to which may be applied a voltage of value $-V_N$. The OT 303 has a second electrode coupled to a positive supply voltage input 325 to which may be applied a voltage of value $+V_P$. The OT 303 has a first electrode coupled to a second electrode of OT 304 and to the output 310. The absolute values of the positive and negative supply voltages, $+V_P$ and $-V_N$, may be equivalent, but are not necessarily equivalent.

The OSIC 350 comprises four organic transistors (OTs) 301, 302, 303, 304, an input terminal 305, and an output terminal 311. The OSIC 350 differs from the OSIC 300 in that the output terminal 311 is coupled to a node that includes the gate and first electrode of OT 304 and the gate and second electrode of OT 302. Furthermore, there is no output at the node of the first electrode of OT 303 and the second electrode of OT 304.

Referring to FIG. 4, an electrical schematic diagram shows an organic semiconductor inverting circuit (OSIC) 400, 450 in accordance with fifth and sixth embodiments of the present invention. The OSIC 400 comprises four organic transistors (OTs) 401, 402, 403, 404, an input terminal 405, and an output terminal 410. OT 401 is an input transistor that has a gate coupled to the input terminal 405 and to a gate of OT 403; a first electrode coupled to a gate and a second electrode of OT 402, to a first electrode of OT 404; and a second electrode coupled to a reference supply voltage input 415 (also referred to as a ground of the OSIC 400). The OT 402 has a first electrode coupled to a negative supply voltage input 420 to which may be applied a voltage of value $-V_N$. The OT 403 has a second electrode coupled to a positive supply voltage input 425 to which may be applied a voltage of value $+V_P$. The OT 403 has a first electrode coupled to a gate and second electrode of OT 404 and to the output 410. The absolute values of the positive and negative supply voltages, $+V_P$ and $-V_N$, may be equivalent, but are not necessarily equivalent.

The OSIC 450 comprises four organic transistors (OTs) 401, 402, 403, 404, an input terminal 405, and an output terminal 411. The OSIC 450 differs from the OSIC 400 in that the output terminal 411 is coupled to a node that includes the first electrode of OT 404 and the gate and second electrode of OT 402. Furthermore, there is no output at the node of the first electrode of OT 403 and the gate and second electrode of OT 404.

The organic semiconductor inverting circuits 100, 200, 300, 350, 400, 450 comprise the following elements in common:
- at least three organic transistors, one of which is an input transistor having a gate to which is coupled an input terminal;
- an output terminal coupled to a first electrode of at least one of the at least three organic transistors;
- a reference supply voltage input coupled to a second electrode of at least one of the at least three organic transistors;
- a first positive supply voltage input coupled to a second electrode of at least one of the at least three organic transistors; and
- a negative supply voltage input coupled to a first electrode of at least one of the at least three organic transistors.

Samples of the organic semiconductor inverting circuits 100, 200, 300, 350, 400, 450 were designed and built using organic transistors most representative of current printed (non-vacuum) manufacturable technology. Selected circuits were aged for a minimum of 1 month in a dry box under a nitrogen atmosphere. Device technology that was the most repeatable as well as the most stable over time was selected for circuit design and fabrication. The technology used consists of screen-printed dielectric and source-drain elements on top of a copper print/etch gate electrode on a polyester substrate. Alternatively, the copper gate print/etch layer can be substituted with a screen-printed gate element. The organic semiconductor material was deposited by non-contact micro dispensing. This device technology has shown stability in a dry nitrogen atmosphere for over 3–4 months without any protective barrier materials, while exhibiting predictable and repeatable electrical performance. Device behavior was also repeatable over time and from device-to-device.

The selection of OT geometry of the samples was based on readily available devices, using geometries compatible with high-throughput print techniques. Available geometries for the channel length, L, and channel width, W, were L={0.10, 0.15, 0.20, 0.30} mm, and W={2.5, 5.0} mm. Device channel widths were held constant at W=5.0 mm as channel length was modified.

Whenever practical, the same devices were repeatedly used for each series of tests. Devices were interconnected using copper wire and standard Sn—Pb solder, attached to the copper test pads on each device.

All tests were conducted in the dark (using a dark box) and under ambient conditions (room temperature, pressure, and humidity). For each test, device temperature and sample chamber humidity were recorded. No significant changes in device behavior were observed for the recorded changes in either temperature or humidity during test.

The OT devices designed and fabricated in accordance with the embodiments of the present invention described above are p-channel devices that may be switched on with negative supply voltages, but typically require significantly positive voltages to fully switch off (due to a positive threshold voltage). A split supply was used for optimal circuit performance. A symmetrical split supply having $|+V_P|=|-V_N|$ was used for testing OSICs 200, 300, 350, 400, and 450. Although a symmetrical split supply may be less desirable than a single supply, it has advantages over other multiple-voltage alternatives. One advantage of a symmetrical split supply is realized at the product level for some indicator technologies, where a reversal of supply polarity voltage is necessary to switch the state of an indicator. Such indicator technologies include electrochromics, electrophoretics, and cholesterics. Therefore, the use of a symmetrical supply may be a preferred option for product-level design.

The optimization of device geometry is crucial for proper inverter operation due to the relatively low on/off ratio (100 to 10,000) of OTs fabricated using currently available materials. It is desirable to select the geometries of the devices so that adequate voltage division is achieved throughout the full range of input voltages in order to obtain useful output values, while maintaining other desirable circuit attributes, such as high inverter gain.

From the experiments conducted with the organic semiconductor inverting circuits 200, 300, 350, 400, 450 using $-V_N=-100$ volts and $+V_P=100$ volts, the following general conclusions were drawn.

1) When OT 201, 301, 401 has sufficient channel resistance, the output 210, 310, 311, 410, 411 may be held at adequately positive voltages. In some examples, it was found that when the channel length of OT 201, 301, 401 was 0.3 mm (creating a relatively resistive path), the output was able to swing very close to $+V_P$ when a negative voltage was applied to the organic semiconductor inverting circuit input 205, 305, 405.

2) A balanced channel resistance may be preferable for OT 202, 302, 402, as excessively low or excessively high channel resistances appear to have a detrimental effect on performance in some applications. When the channel is too conductive (e.g., channel length is 0.1 mm), the output 210, 310, 311, 410, 411 may not be able to swing sufficiently towards +$V_P$, plus the inverter gain may be significantly reduced. When the channel resistance is too large, the transition from positive to negative output occurs at relatively high positive input voltages (transitions have been shown to occur when the input voltage is only a few volts more negative than +$V_P$). Additionally, the output is unable to swing negative at all, and inverter gain is significantly reduced.

3) It may be preferable for OT 203, 303, 403 to be the most resistive OT (i.e., have the highest channel resistance). Since the second electrode of OT 203, 303, 403 is tied to +$V_P$, the gate is always more negative than the voltage at the second electrode. Therefore, OT 203, 303, 403 will tend to always be on to some degree (due to the significantly positive threshold voltages). When OT 203, 303, 403 is not sufficiently resistive, the inverter may fail to pull the output to negative values. With insufficient channel resistance in OT 203, 303, 403, the output 210, 310, 311, 410, 411 may not be held negative when the input voltage drops below about $0.5 \times +V_P$.

Samples of three primary embodiments of the four transistor organic semiconductor inverting circuits 200, (300 & 350), and (400 & 450) were tested. The difference between each of the three primary embodiments is the connection of OT 204, OT 304, OT 404, which modifies the connection of the output of stage 1 (OT 201 & 202, OT 301 & 302, OT 401 & 402) of the organic semiconductor inverting circuits to OT 203, 303, 403 and the output terminal 210, 310, 311, 410, 411.

Referring to FIG. 5, a graph shows plots of exemplary curves obtained by testing samples of organic semiconductor inverting circuits (OSICs), in accordance with embodiments of the present invention. Table 1 lists the OSIC embodiments tested and the channel lengths, in millimeters, of the organic transistors tested. The channel width in all cases was 5.0 mm.

above. OSICs 300, 400 are very similar in design to one another, with the first electrode of OT 304, 404 connected to the output of stage 1 (OT 301 & OT 302, OT 401 & OT 402). The gate terminal of OT 304 is connected to the first electrode of OT 304 in OSIC 300, and to the second electrode of OT 404 and output terminal 410 in OSIC 400. In the case of OSIC 400, the circuit structure results in two identical two-device inverters, the power supply of stage 2 (OT 403 & 404) connected to the output of stage 1. For both OSIC 300 and OSIC 400, the output of stage 1 is passed to the output terminal when the input terminal is positive (OT 303, 403 at high resistance). For negative input voltage, the stage 1 output is pulled towards ground and the output is dominated by the low-resistance path to +$V_P$ through OT 303, 403. OT 304, 404 acts as a load which allows a voltage drop between the stage 1 output and the output terminal, allowing the output terminal to swing positive. In OSIC 300, the resistance of OT 304 is governed by the voltage of stage 1, while in OSIC 400 this resistance is dependent on the voltage of the output terminal. Both OSIC 300 and OSIC 400 were able to deliver reasonable performance with the on/off ratios (on the order of 100 to 1000) of the first stages of the sample devices.

Curves 520, 525 are plots of voltages at the output terminals 310, 410 versus voltages at the input terminals 305, 405 of OSICs 300, 400, with the geometries shown above. OSIC 350 and OSIC 450 are electrically identical to OSICs 300, 400, respectively, except that the output terminal 311, 411 is defined as the output of stage 1. In this configuration, it was more difficult to obtain acceptable behavior for negative output voltages. This is primarily due to the lack of isolation of the output terminal from system ground, which resulted in the output terminal 311, 411 being pulled increasingly towards ground as the input voltage became more negative (as OT 301, OT 401 decreases in resistance). Good performance of OSIC 350 is achievable when the channel resistance of OT 301 is sufficiently high and the channel resistance of 302 is properly balanced, which is demon-

TABLE 1

| OSIC 200 Plot 505 | | OSIC 300 Plot 510 | | OSIC 350 Plot 520 | | OSIC 400 Plot 515 | | OSIC 450 Plot 525 | |
|---|---|---|---|---|---|---|---|---|---|
| OT | L(mm) | OT | L(mm) | OT | L(mm) | OT | L(mm) | OT | L(mm) |
| 201 | 0.3 | 301 | 0.3 | 301 | 0.3 | 401 | 0.2 | 401 | 0.3 |
| 202 | 0.3 | 302 | 0.15 | 302 | 0.15 | 402 | 0.1 | 402 | 0.1 |
| 203 | 0.2 | 303 | 0.3 | 303 | 0.3 | 403 | 0.3 | 403 | 0.3 |
| 204 | 0.15 | 304 | 0.1 | 304 | 0.1 | 404 | 0.1 | 404 | 0.1 |

Curve 505 is a plot of voltage at the output terminal 210 versus voltage at the input terminal 205 of OSIC 200. It will be appreciated that in organic semiconductor inverting circuit 200 the output of stage 1 (OT 201 & 202) is coupled to the gate electrode of OT 204. The first electrode of OT 204 is connected to $-V_N$. Stage 1 controls the resistance of OT 204, and along with OT 203, results in a voltage divider circuit for the output terminal. Experiments with OSIC 200 show that the circuit exhibits inverting behavior but has a non-symmetric behavior. The performance of OSIC 200 may be more symmetric with OT devices that possess larger on/off ratios (greater than $10^4$ or $10^5$).

Curves 510, 515 are plots of voltages at the output terminals 310, 410 versus voltages at the input terminals 305, 405 of OSICs 300, 400, with the geometries shown strated by curve 520—obtained with a channel length of 0.3 mm for OT 301 and a channel length of 0.15 mm for OT 302.

Figure 6:
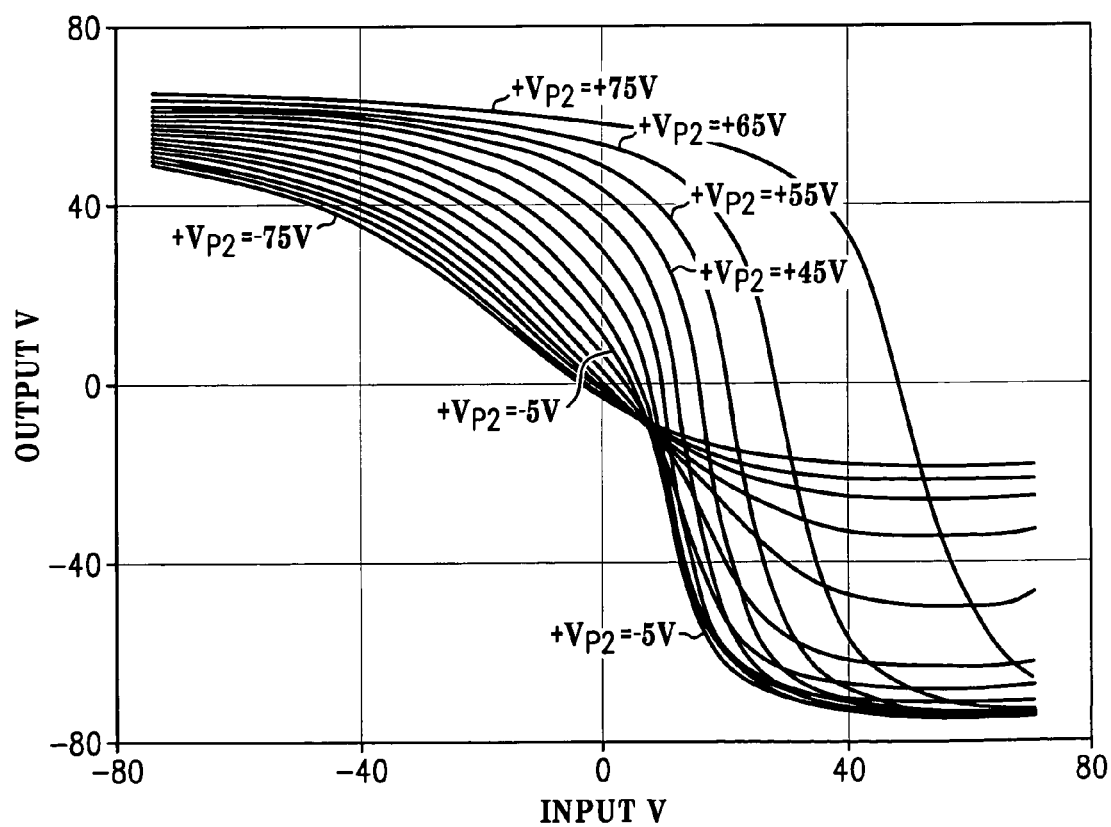
FIG. 6 is a graph that shows plots of exemplary curves obtained by testing a sample of an OSIC, in accordance with a first embodiment of the present invention.

Referring to FIG. 6, a graph shows plots of exemplary curves obtained by testing a sample of organic semiconductor inverting circuit (OSIC) 100, in accordance with the first embodiment of the present invention. The performance of the OSIC 100 may be enhanced when OT 102 has a sufficiently high resistance. When the channel of OT 102 is too conductive (e.g., channel length is 0.1 mm), the output voltage does not swing sufficiently towards +$V_{P1}$, and the inverter gain is reduced. Increases in the channel resistance of OT 102 result in improved output voltage swing towards +$V_{P1}$, and improved inverter gain.

For similar reasons that high channel resistance of OT 203, 303, 403 benefits the four-transistor OSIC 200, 300, 350, 400, 450 designs, OSIC 100 typically benefits from a high channel resistance of OT 101. Since the second electrode of OT 101 is tied to $+V_{P1}$, the gate voltage of OT 101 is always more negative than the second electrode voltage. Therefore, OT 101 is normally on to some degree (due to the significantly positive threshold voltages of the OT transistors being used in these samples). When OT 101 is not sufficiently resistive, the OSIC 100 will fail to pull the output voltage to negative values.

The channel resistance for OT 103 was chosen to be highly resistive (channel length of 0.3 mm) in order to minimize power supply current drain. Note that a channel resistance of OT 103 that is too low may cause the output to not be able to swing sufficiently towards either $+V_{P1}$ or $-V_N$.

For the sample OSIC 100 used to obtain the plots in FIG. 6, the channel widths of OT 101, OT 102, and OT 103 were all 5.0 mm. The channel length of OT 101 was 0.2 mm, the channel length of OT 102 was 0.1 mm, and the channel length of OT 103 was 0.3 mm. The first positive supply voltage, $+V_{P1}$, and the negative supply voltage, $-V_N$, were fixed at +75 volts and −75 volts, respectively. Plots of voltages measured at output terminal 110 versus voltages applied at input terminal 105 were taken for a set of second positive voltages, $V_{P2}$, ranging from −75 volts to +75 volts. When $V_{P2}$ is at −5 volts, it can be seen that the transition from a positive output voltage to a negative output voltage (which is the offset) occurs with approximately +7 volts at the input terminal 105. The absolute gain at this transition point is on the order of 3. The performance of the sample OSIC 100 when $+V_{P2}$ is tied to the reference supply voltage, which is one variant of OSIC 100 described above, can be inferred by interpolating between the plots for $+V_{P2}=-5$ volts and $+V_{P2}=+5$ volts. The performance of the sample OSIC 100 when $+V_{P2}$ is tied to $+V_{P1}$, which is another variant of OSIC 100 described above, can be inferred from the plot for $+V_{P2}=+75$ volts. From these plots, it will be appreciated that OSIC 100 provides a usable inversion of the input signal when $+V_{P2}$ is tied to the reference supply voltage.

Referring to FIG. 7, an electrical schematic shows a ring oscillator 700, in accordance with an embodiment of the present invention. The ring oscillator comprises four OSICs 701, 702, 703, 704, each of which is an OSIC 400 as described above. Three of the OSICs 701, 702, 703 are coupled in a series ring (the output terminal 410 of each of three of the OSICs 701, 702, 703 is coupled to the input terminal 405 of the next OSIC in the ring), and a fourth OSIC 703 coupled to an output terminal 410 of one of the three OSICs 701, 702, 703 in the series ring. The input terminal 405 of the OSIC 701 forms an input terminal of the ring oscillator 700, and the output terminal 410 of the OSIC 704 forms an output terminal of the ring oscillator 700. A test circuit was constructed in which the channel lengths of OT 401, OT 402, OT 403, OT 404 of each OSIC in the ring oscillator 700 were, respectively, 0.2 mm, 0.15 m, 0.3 mm, and 0.1 mm, and the channel widths were all 5.0 mm. The positive supply voltage, $+V_P$, and the negative supply voltage, $-V_N$, were +100 volts and −100 volts, respectively. This ring oscillator 700 therefore comprises an OSIC 400 having a selected channel material and a set of channel geometries, wherein the transfer characteristics of the OSIC 400 are such that a ring oscillator circuit operation is obtained using the OSIC 400 with a plurality of OSICs 400 having essentially identical channel material and channel geometry.

A similar ring oscillator test circuit was constructed using four OSICs 100 (not shown in FIGS. 1–7) similarly intercoupled, in which the channel lengths of OT 101, OT 102, OT 103 were, respectively, 0.3 mm, 0.15 m, and 0.3 mm, and the channel widths were all 5.0 mm. The first positive supply voltage, $+V_{P1}$, the second positive supply voltage, $+V_{P2}$, and the negative supply voltage, $-V_N$, were +75 volts, +75 volts, and −75 volts, respectively. Both ring oscillators were self-starting. The ring oscillator 700 constructed of OSICs 400 oscillated at a frequency of approximately 0.01 Hz. The ring oscillator constructed of OSICs 100 oscillated at a frequency of approximately 0.02 Hz. It will be appreciated that other ring oscillators could be constructed comprising an odd number of OSICs selected from the OSICs 100, 200, 300, 350, 400, 450 described herein, coupled in a series ring, wherein the geometries are selected to provide transfer characteristics that ensure compatible inputs and outputs.

It will be appreciated by now that a variety of organic semiconductor inverting circuits have been described that generate an input to output signal inversion that is satisfactory for use in a ring oscillator, and may be used with other logic circuits such as NAND, NOR, AND, and OR circuits to form other logic functions. Level shifting circuits may be used with other logic circuits, either organic or inorganic, to adapt the inputs and outputs of the OSICs 100, 200, 300, 350, 400, 450 to logic technologies having different characteristics. The logic functions thus formed may provide any of the wide variety of logic functions in current use, within limits imposed by the volume and speed of the organic transistors.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "including" and/or "having", as used herein, are defined as comprising. The term "coupled", as used herein with reference to electro-optical technology, is defined as connected, although not necessarily directly, and not necessarily mechanically.

What is claimed is:

1. An organic semiconductor inverting circuit, comprising:
   at least three organic transistors, one of which is an input transistor having a gate to which is coupled an input terminal;
   an output terminal coupled to a first electrode of at least one of the at least three organic transistors;
   a reference supply voltage input coupled to a second electrode of at least one of the at least three organic transistors;
   a first positive supply voltage input coupled to a second electrode of at least one of the at least three organic transistors; and a negative supply voltage input coupled to a first electrode of at least one of the at least three organic transistors, wherein a first electrode of the input transistor is coupled to a second electrode and a gate of one of the at least three organic transistors that has a first electrode coupled to the negative supply voltage input, and wherein the second electrode of the input transistor is coupled to the first positive supply voltage input, and wherein the first electrode of the input transistor is also coupled to a first electrode of another of the at least three organic transistors, which has a second electrode coupled to the reference supply voltage input and a gate coupled to a second positive supply voltage input.

2. The organic semiconductor inverting circuit according claim 1, wherein absolute values of voltages coupled to the first positive supply voltage input and the negative supply voltage input with reference to a voltage coupled to the reference supply voltage input are substantially equal.

3. The organic semiconductor inverting circuit according claim 2, wherein an absolute gain of the organic semiconductor inverting circuit is greater than one over a range of voltage applied to the input terminal.

4. The organic semiconductor inverting circuit according to claim 2 comprising a selected channel material and set of channel geometries, wherein transfer characteristics of the organic semiconductor inverting circuit are such that a ring oscillator circuit operation is obtained using the organic semiconductor inverting circuit with a plurality of organic semiconductor inverting circuits having essentially identical channel material and sets of channel geometries.

5. The organic semiconductor inverting circuit according to claim 1, wherein a voltage coupled to the second positive supply voltage input is less positive than a voltage applied to the first positive supply voltage input with reference to a voltage at the reference supply voltage input.

6. The organic semiconductor inverting circuit according to claim 1, wherein the second positive supply voltage input is connected to one of the first positive supply voltage input and the reference supply voltage input.

7. The organic semiconductor inverting circuit according to claim 1, further comprising a fourth organic transistor, wherein a first electrode of the input transistor is coupled to a second electrode and a gate of one of the at least three organic transistors that has a first electrode coupled to the negative supply voltage input, and wherein the second electrode of the input transistor is coupled to the reference supply voltage input, and wherein the input terminal is also coupled to a gate of another of the at least three organic transistors that has a second electrode coupled to the first positive supply voltage input and a first electrode coupled to an output terminal and a second electrode of the fourth organic transistor that has a gate coupled to the first electrode of the input transistor and a first electrode coupled to the negative supply voltage input.

8. The organic semiconductor inverting circuit according to claim 1, further comprising a fourth organic transistor, wherein a first electrode of the input transistor is coupled to a second electrode and a gate of one of the at least three organic transistors that has a first electrode coupled to the negative supply voltage input, and wherein a second electrode of the input transistor is coupled to the reference supply voltage input, and wherein the input terminal is also coupled to a gate of another of the at least three organic transistors that has a second electrode coupled to the first positive supply voltage input and a first electrode coupled to a second terminal of the fourth organic transistor, which has a gate and first electrode coupled to the first electrode of the input transistor.

9. The organic semiconductor inverting circuit according to claim 8, further comprising an output terminal coupled to one of the first and second electrodes of the fourth organic transistor.

10. The organic semiconductor inverting circuit according to claim 1, further comprising a fourth organic transistor, wherein a first electrode of the input transistor is coupled to a second electrode and a gate of one of the at least three organic transistors that has a first electrode coupled to the negative supply voltage input, and wherein the second electrode of the input transistor is coupled to the reference supply voltage input, and wherein the input terminal is also coupled to a gate of another of the at least three organic transistors that has a second electrode coupled to the first positive supply voltage input and a first electrode coupled to a gate and a second electrode of the fourth organic transistor, which has a first electrode coupled to the first electrode of the input transistor.

11. The organic semiconductor inverting circuit according to claim 10, further comprising an output terminal that is coupled to one of first and second electrodes of the fourth organic transistor.

12. The organic semiconductor inverting circuit according to claim 1, where the on/off ratio of at least one organic transistor of the three organic transistors is less than 100,000.

13. The organic semiconductor inverting circuit according to claim 1, where at least one element of each of the at least three organic transistors is formed by a printing process.

14. The organic semiconductor inverting circuit according to claim 1, where at least one element of each of the at least three organic transistors is deposited by one of the group of processes consisting of gravure, flexography, intaglio, screen printing, micro dispensing, micro contact printing, and lithographic printing.

* * * * *